United States Patent [19]

Hunsinger et al.

[11] Patent Number: 5,420,448
[45] Date of Patent: May 30, 1995

[54] COMPLEMENTARY ACOUSTIC CHARGE TRANSPORT DEVICE AND METHOD

[75] Inventors: Billy J. Hunsinger, Urbana; Michael J. Hoskins, Champaign, both of Ill.

[73] Assignee: Electronic Decisions Incorporated, Urbana, Ill.

[21] Appl. No.: 443,031

[22] Filed: Dec. 1, 1989

Related U.S. Application Data

[63] Continuation of Ser. No. 15,711, Feb. 17, 1987, abandoned.

[51] Int. Cl.6 .......................................... H01L 29/84
[52] U.S. Cl. ...................................... 257/245; 257/416; 257/241; 333/165; 310/313 R; 310/313 B
[58] Field of Search .................. 357/24, 24 M, 25, 26; 333/165, 151, 194, 196, 153, 195; 310/313 D, 313 B, 313 R, 366, 313 A; 257/241, 245, 416

[56] References Cited

U.S. PATENT DOCUMENTS

| | | | |
|---|---|---|---|
| 3,675,052 | 7/1972 | Lindsay et al. | 310/8.1 |
| 3,749,984 | 7/1973 | Benyon, Jr. et al. | 357/41 |
| 3,800,248 | 3/1974 | Speiser et al. | 333/30 R |
| 3,858,232 | 12/1974 | Boyle et al. | 357/24 |
| 3,862,431 | 1/1975 | Quate et al. | 307/88.3 |
| 3,903,406 | 9/1975 | London | 357/26 |
| 4,005,318 | 1/1977 | Claiborne, Jr. | 357/26 |
| 4,016,412 | 4/1977 | Stern et al. | 235/181 |
| 4,034,332 | 7/1977 | Alais | 367/153 |
| 4,065,736 | 12/1977 | London | 357/26 |
| 4,084,107 | 3/1978 | Ohba et al. | 307/221 D |
| 4,207,546 | 6/1980 | Grudkowski | 357/26 |
| 4,210,825 | 7/1980 | Crochiere et al. | 307/221 D |
| 4,224,683 | 9/1980 | Adkins | 364/821 |
| 4,253,168 | 2/1981 | Petrosky et al. | 357/24 |
| 4,255,725 | 3/1981 | Berger et al. | 333/165 |
| 4,389,590 | 6/1983 | Whitlock | 310/313 R |
| 4,491,811 | 1/1985 | Niitsuma et al. | 333/151 |
| 4,527,117 | 7/1985 | Morgan et al. | 324/121 R |
| 4,600,853 | 7/1986 | Whitlock et al. | 310/313 B |
| 4,633,285 | 12/1986 | Hunsinger et al. | 357/26 |
| 4,665,374 | 5/1987 | Fathimulla | 357/26 |
| 4,697,115 | 9/1987 | Mitsutsuka | 310/313 R |
| 4,748,364 | 5/1988 | Mitsutsuka | 310/313 D |
| 4,764,701 | 8/1988 | Garbacz et al. | 310/313 R |
| 4,799,244 | 1/1989 | Mikoshiba et al. | 357/24 |
| 4,833,479 | 5/1989 | Carlson | 342/194 |

FOREIGN PATENT DOCUMENTS 1009753 5/1977 Canada .................................. 357/24
2571907 10/1985 France .

OTHER PUBLICATIONS

Staples et al. "A Review of Device Technology for Programmable Surface-Wave Filters".
Hoskins et al "Recent Developments in Acoustic Charge Transport Devices".

*Primary Examiner*—John B. Sotomayor
*Attorney, Agent, or Firm*—Joseph W. Berenato, III

[57] ABSTRACT

A complementary acoustic charge transport circuit element comprises first and second buried channels. Each of the channels is comprised of a piezoelectric semiconductor and each channel has a source through which charge is injected and a drain through which charge is extracted. A transducer propagates an acoustic wave through each channel and the propagated waves transport the charge between the sources and the drains. A source and/or a drain of one channel is connected in parallel with the corresponding souce and/or drain of the other channel. The waves are complementary at the interconnected ones of the sources and/or the drains.

54 Claims, 6 Drawing Sheets

FIG. 3a
CHANNEL 1
INPUT SIGNAL

FIG. 3b
CHANNEL 1 CHARGE
PACKET SIGNAL
AFTER INPUT
SAMPLING

FIG. 3c
CHANNEL 1
DRAIN
CURRENT

FIG. 3d
CHANNEL 2
INPUT
SIGNAL

FIG. 3e
CHANNEL 2
CHARGE PACKET
SIGNAL AFTER
INPUT SIGNAL

FIG. 3f
CHANNEL 2
DRAIN
CURRENT

FIG. 3g
MULTIPLEXED
OUTPUT

FIG. 4a
CHANNEL 1
INPUT SIGNAL

FIG. 4b
CHANNEL 1
CHARGE
PACKET SIGNAL
AFTER INPUT
SAMPLING

FIG. 4c
CHANNEL 1
DRAIN
CURRENT

FIG. 4d
CHANNEL 2
INPUT
SIGNAL

FIG. 4e
CHANNEL 2
CHARGE
PACKET SIGNAL
AFTER INPUT
SIGNAL

FIG. 4f
CHANNEL 2
DRAIN
CURRENT

FIG. 4g
MULTIPLEXED
OUTPUT

COMPLEMENTARY ACOUSTIC CHARGE TRANSPORT DEVICE AND METHOD

GOVERNMENT SUPPORT

This invention was made with government support under contract number F-30602-84-C-0126 awarded by the Department of Defense. The government may have certain rights in this invention.

This application is a continuation of application Ser. No. 015,711, filed Feb. 17, 1987, abandoned.

BACKGROUND OF THE INVENTION

An acoustic charge transport device ("ACT device") is a novel analog semiconductor device which is particularly useful as a delay line and for performing various signal processing functions. An ACT device overcomes many of the problems of the prior charge-coupled devices ("CCD") because the ACT device processes signals at extremely high speeds while avoiding the necessity of clock driver and certain other circuitry. An ACT device achieves its high processing speed because a surface acoustic wave ("SAW") propagates through a channel buried within the piezoelectric semiconductor substrate and the wave transports the charge through the channel. The charge is transported in discrete identifiable packets which move at the speed of the wave.

Transportation of charge through the buried channel produces an output at the drain (output contact) which is in the form of sharp current pulses. These current pulses originate from the drain only when the SAW voltage under the drain is positive, because the electron packets are carried in the positive half cycles of the SAW voltage. Therefore, it is possible to monitor the pulses after transport through the channel and to determine the quantity of charge that was transported.

The voltage-to-charge conversion process occurring at the ACT device source (input contact) is one wherein the amount of charge injected into each packet is proportional to the input voltage at specific sample points in time. In the ACT device, these sample points tend to occur at the instants in time when the positive peaks of the SAW potential are under the source. Hence, the input section of the ACT device operates as an automatic time domain sampler having a sampling rate equal to the SAW frequency.

In theory, an ideal sampler would produce a sample (charge packet) which is proportional to the analog input voltage at specific exact instants in time. The achievement of the ideal sampler, however, requires a physical process or circuit element which can turn on and off, or switch, infinitely fast. Actual physical devices have finite switching times which cause the sample amplitude to be proportional to a weighted average of the input signal over the switching time. This switching time is referred to as the sampling aperture. The primary impact of a finite sampling aperture is to limit the precision with which the sample can be formed. This, in turn, tends to limit the highest frequency of input signal which can be unambiguously sampled. The sampling aperture of the input sampling mechanism of the ACT device is very short, and is substantially equal to approximately one tenth (1/10) of the SAW period. Hence, in principle, the ACT device input is capable of high speed voltage-to-charge conversion over a wide bandwidth of input frequencies, up to approximately ten times the SAW frequency.

Prior art structures have not been able to take full advantage of the high speed input properties of the ACT device. The prior structures limited the sampling rate to the SAW frequency, even though the input charge injection process is capable of injecting charge at a rate substantially equal to approximately ten times the SAW frequency. In analog signal processing applications, the limitation of the sampling rate at the SAW frequency also limits the signal bandwidth obtained in the devices to one half of the SAW frequency, because of the Nyquist criteria.

In view of the above, it can be seen that there is a need for a structure permitting maximum utilization of the high speed processing capabilities of the ACT device. The disclosed invention is a novel arrangement of at least two ACT devices, so that the waves are complementary at specific points, in a manner which overcomes the limitation of the SAW frequency sample rate. In addition, the Nyquist limited signal bandwidth is correspondingly extended in certain embodiments.

The complementary ACT device ("C-ACT device") is a circuit element which combines two or more similar ACT devices by the parallel connection of the sources and/or the drains thereof. The SAWs of the devices are complementary in phase with respect to the connected sources and/or drains, so that the input sampling time intervals and/or the output detection intervals are staggered, thereby permitting input sampling and output detection at a rate equal to N times the SAW frequency, where N is the number of devices which are connected. The invention may be realized by externally interconnecting discrete devices, or by integrating the required multiple ACT transport channels on one chip in a parallel configuration. In the latter case, which is particularly useful for achieving the required accurate signal balance between channels, the composite circuit element forms a new device with terminal properties considerably different from those obtained from a prior art ACT device.

OBJECTS AND SUMMARY OF THE INVENTION

The primary object of the disclosed invention is to provide complementary ACT structures which overcome the input sampling rate, output detection rate and Nyquist criterion limitations of the prior art devices.

A further object of the disclosed invention is to provide a complementary ACT circuit element which can be conveniently configured, either as a discrete element or as an integrated element, as a multiplexer, a demultiplexer or a high speed delay line.

The disclosed invention is a circuit element comprising first and second buried channels, each of the channels are comprised of a piezoelectric semiconductor which is overlayed with a barrier material and each of the channels is bounded by an electrical isolating structure which is, preferably, transparent to the acoustic waves in the integrated device. First and second sources are provided and each is associated with one of the channels and are disposed at one end thereof. First and second drains are likewise provided and are associated with the channels and are disposed at another end thereof so that the barrier material is disposed between the associated sources and drains. A SAW transducer propagates an acoustic wave through each channel for transporting injected charge between the associated source and the drain. The sources and/or the drains are connected in parallel and are disposed relative to the transducer so that the SAWS are complementary at the interconnected sources and/or drains.

These and other objects and advantages of the invention will be readily apparent in view of the following description and drawings of the above described invention.

DESCRIPTION OF THE DRAWINGS

The above and other objects and advantages and novel features of the present invention will become apparent from the following detailed description of the preferred embodiment of the invention illustrated in the accompanying drawings, wherein.

DESCRIPTION OF THE INVENTION

An N-complementary (or N-phase) SAW signal set consists of N sinusoidal SAW signals with phases, as observed at the chosen observation point, which differ by 360°/N. A precise mathematical definition of these signals is:

$$\phi_i(\tau) = A\cos\left[2\pi f_0\tau + \phi_o + i\left(\frac{2\pi}{n}\right)\right]$$

wherein $\phi_i\tau$ is the time varying surface potential of the SAW, as observed at the chosen observation point of the ith delay line. A is the amplitude of the surface potential; $f_0$ is the SAW frequency, and $\theta_0$ is an arbitary phase shift common to all delay lines. The index i runs from 1 to N. This signal set has the property that the sum of the signals is 0 for all times. The phase relationship between these signals can be shown pictorially as a vector phase diagram where N can be any integer greater than or equal to 2.

The C-ACT circuit element may be advantageously configured into any one Of three basic signal processors. The first is a complementary multiplexer ACT which performs the function of a time domain multiplexer. The second type is a complementary demultiplexer, while the third type is a complementary demultiplexer-multiplexer which operates as a delay line with increased sampling rate.

The complementary multiplexer ACT circuit element preferably consists of two or more (N) nearly identical ACT delay lines or devices. The SAW signals are N-phase complementary at the drains of the delay lines and the drains are electrically interconnected in parallel. Because of the high speed sampling properties of the ACT charge injection structures and the complementary phase relationship between the SAWs of the delay lines, the separate input signals applied to each delay line input are sampled at staggered points in time, delayed and detected at staggered points in time. The interconnection of the delay line drains combines the delayed versions of the time staggered input signal samples to achieve a series of output signal samples which are the time multiplex of the input signal samples. If the number of delay lines is N, then the circuit element realizes an N to 1 multiplexer.

The complementary demultiplexer ACT circuit element preferably consists of two-or more (N) nearly identical ACT delay lines. The SAW signals are N-phase complementary at the sources of the delay lines and the sources are electrically connected in parallel. A common input signal applied to the interconnected sources is sequentially sampled at staggered points in time by each delay line source, delayed and detected at the respective delay line drains at staggered points in time. The N outputs of the delay lines therefore represent the time demultiplexed outputs associated with the input signal, and this circuit element realizes a one to N time demultiplexer.

The complementary multiplexer ACT and the complementary demultiplexer ACT may be used for time domain multiplexing and time domain demultiplexing, respectively, of either analog or digital signals. These devices have simple implementation and do not require the high speed switches and sampling circuits normally used in prior art multiplexers and demultiplexers. A particularly attractive feature of the complementary multiplexer ACT is that any undesired interference, caused by SAW signal detection at the delay line drains, is minimized or cancelled at the common drain connection due to the complementary phase relationship of the SAW signals.

The complementary demultiplexer-multiplexer ACT circuit elements functions as a delay line having increased sampling rate. This circuit element preferably consists of two or more (N) identical ACT delay lines in which the SAW signals are N-phase complementary at the sources and the drains of the delay lines. The drains and the sources are electrically connected in parallel. This circuit element may be viewed as a time demultiplexer having its N outputs directly connected to the N inputs of-a time multiplexer. This interface connection is achieved directly in the charge transport channels and, hence, is transparent to the user of the device. The circuit element thus obtained performs as an increased rate delay line sampling system by sampling the input signal at a rate of $Nf_0$, demultiplexing the signal samples into charge packet signals with sample rate $f_0$ in each delay line, delaying the charge packet signals by transport with the SAW wave, and multiplexing the N SAW frequency rate signal samples from the channels into a common output signal with a sample rate of $Nf_0$. From a terminal standpoint, the demultiplexing and multiplexing operations are also transparent to the user and the circuit element behaves as a single input-single output delay line with a sample rate equal to $Nf_0$.

One of the primary advantages of this delay line implementation is the increased sample rate and the correspondingly increased Nyquist bandwidth ($Nf_0/2$). A further advantage is the cancellation of undesired SAW detection at the delay line output due to the complementary phase relationship of the SAW signals. The delay line furthermore may incorporate non-destructive sense electrodes common to all N channels in order to achieve a tapped delay line with multiple output taps. This multiply tapped delay line is useful for transversal filtering and other signal processing tasks.

Figure 1:
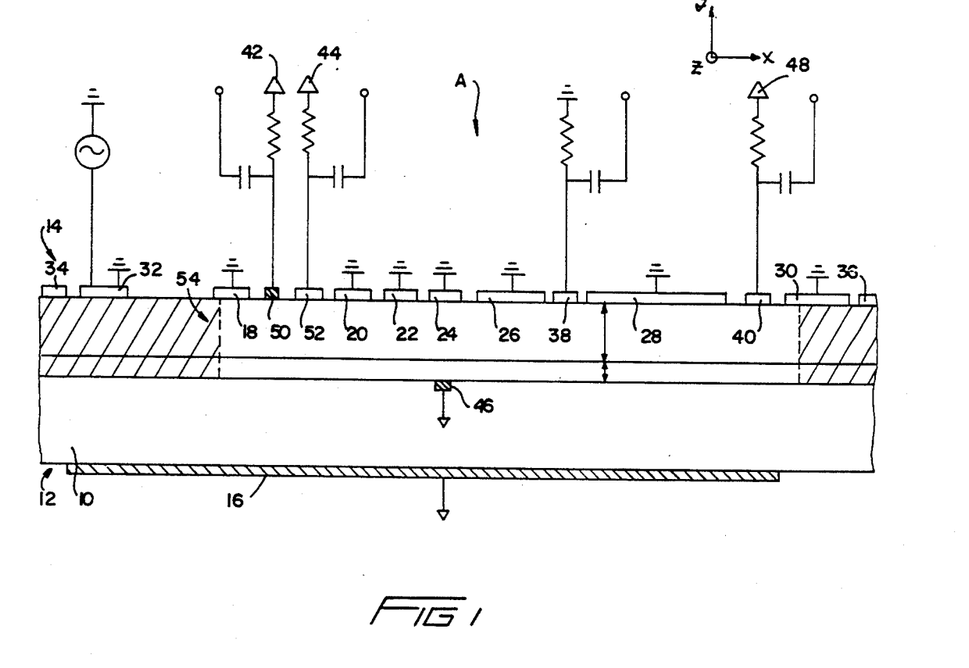
FIG. 1 is a fragmentary cross-sectional view, partially in schematic, illustrating an acoustic charge transport device.
Figure 2:
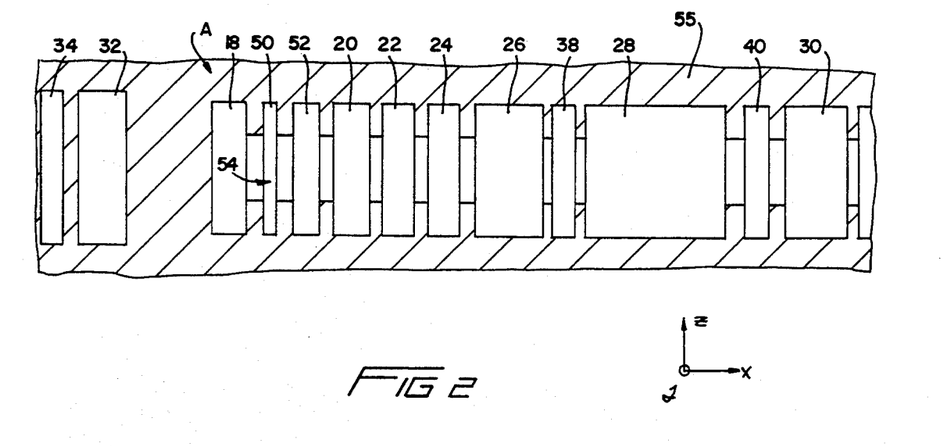
FIG. 2 is a top plan view of the device of FIG. 1.
Figure 3A:
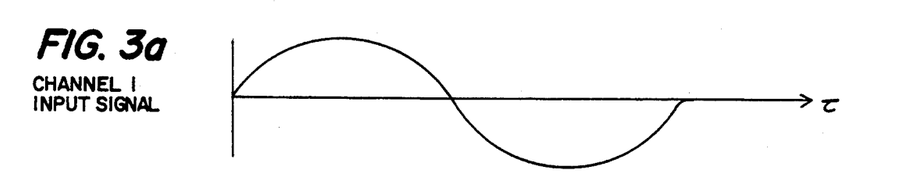
FIGS. 3a–g are graphs illustrating operation of a complementary multiplexer having two channels with equal delay.
Figure 3B:
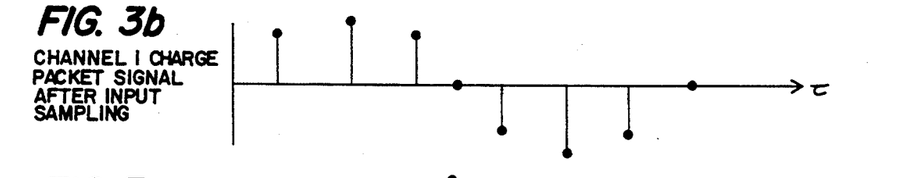
Figure 3C:
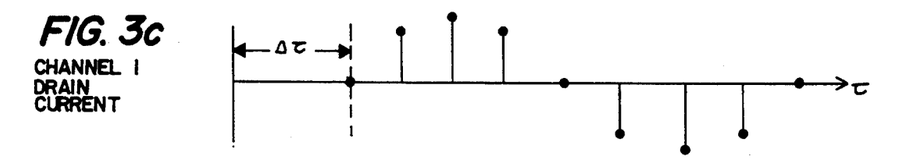
Figure 3D:
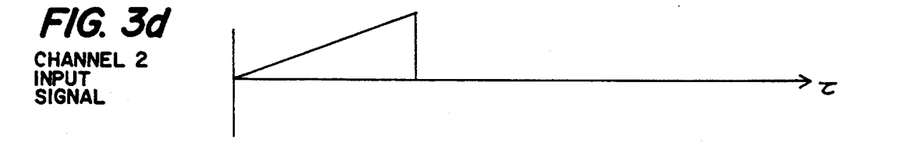
Figure 3E:
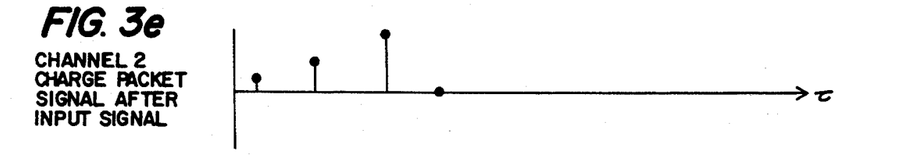
Figure 3F:
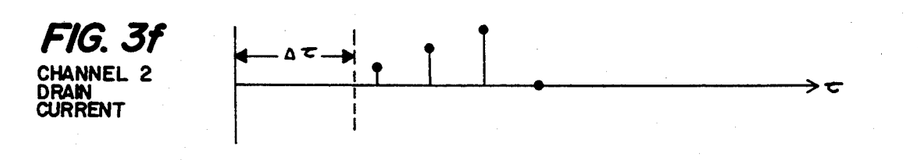
Figure 3G:
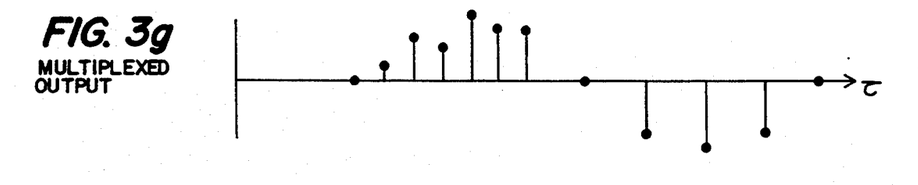

ACT device A, as best shown in FIGS. 1 and 2, comprises a semi-insulating gallium arsenide (GaAs) substrate 10 which is overlayed with an optional p-type GaAs layer 12. An n-type GaAs channel layer 14 overlies the optional p-type layer 12. Preferably, the n-type layer 14 has a thickness of a few microns and a doping level of approximately $10^{15}/cm^3$ to $10^{16}/cm^3$. The p-type layer 12, when used, normally has a doping level of $10^{15}$ to $10^{17}/cm^3$ and a thickness of between about 0.1 to about 5.0 $\mu$m. Contact is usually made to the p-type layer 12, when it is used, in order to support the application of a channel depletion bias voltage. Otherwise, this backgate voltage is applied to an ohmic contact 16 on the lower surface of the semi-insulating substrate 10. For further description of an ACT device, reference may be had to our U.S. Pat. No. 4,633,285 for Acoustic Charge Transport Device and Method, the disclosure of which is incorporated herein by reference.

A front gate depletion bias is applied through Schottky channel plates 18, 20, 22, 24, 26, 28 and 30, and any non-destructive charge sensing electrodes which may be present in the structure. These channel plates are all constructed of Schottky barrier metal and typically have metal thicknesses of a few thousand angstroms. The metal is usually a combination of titanium, aluminum and copper. A multitude of channel plates and electrode schemes are permissible.

The transport channel is defined and electrically isolated in the x and z directions through a high energy proton bombardment processing of the substrate 14. The proton bombarded regions of the epitaxial layers become semi-insulating and have electrical characteristics similar to those of the semi-insulating substrate 10. Typical bombardment energy and proton doses are 600 Kev and $10^{14}/cm^2$, respectively, although these quantities can vary significantly depending upon the structure.

An acoustic wave is propagated through the channel (non-bombarded portion) by a unidirectional transducer assembly which consists, preferably, of an interdigital SAW transducer 32 and a SAW grating reflector 34. This transducer assembly only generates a SAW in the positive x direction, thus increasing transduction efficiency. Typical SAW frequencies are 360 to 1000 MHz, with acoustic intensities of 5 W per centimeter of beam width. At 360 MHz, this intensity produces SAW traveling wave potential magnitudes of approximately 1 V. An acoustic absorber 36 is located at the opposite end of the transport channel to minimize SAW reflections at the edge of the chip. A non-destructive sensing electrode 38 (or an array of such electrodes in the multiple tap delay line) senses the charge packets as they pass underneath. The resulting output signal voltage is usually routed to a high input impedance amplifier with capacitive input impedance for impedance matching. The destructive sense electrode 40 (also known as the drain electrode) provides direct charge extraction from the channel. The electrode 40 may be comprised of Schottky barrier metal, or it may be an ohmic contact material. Typical ohmic contact materials include a two-layer combination of gold and germanium in film form (Au-88%, Ge-12%) with a thickness of approximately 1000 angstroms, as well as a nickel film of approximately 300 angstroms.

DC biases for channel depletion, quiescent current injection and charge extraction are applied at 42, 44, 46 and 48. The input signal may be applied to either the input contact 50 or the input gate 52 through capacitive coupling or via direct coupling. Likewise, the signal coupling capacitors may be omitted at the electrodes 38 and 40, respectively, provided that the proper DC bias voltages are maintained.

As best shown in FIGS. 1 and 2, the transport channel 54 is disposed between the ends of the Schottky channel plates 18-30, and is preferably centrally located therebetween. The transport channel 54 has a width which is less than that of the Schottky channel plates 18-30, underneath which the transport channel 54 is centrally disposed. The transport channel has a depth corresponding substantially to the depth of the n-type layer 14, as well as the p-type layer 12 when that layer is used.

The transport channel 54, as previously noted, is bounded by the high energy proton bombarded sections of the layers 12 and 14. Proton bombardment of the layers is preferred because the resulting matrix electrically isolates one transport channel 54 from an adjacent channel, even though the proton bombarded region 55 is transparent to the acoustic wave generated by the transducer 32. Proton bombardment can be accomplished by conventional masking techniques and permits accurate channel dimensions and configurations to be achieved. Furthermore, proton bombardment permits the ACTs to be integrated onto a single substrate, thereby avoiding signal interference and the like which can occur upon the interconnection of discrete devices.

The electrodes in the transducer 32 and the reflector 34 are very small and are not illustrated in FIG. 2. Those skilled in the art will understand that only the bussbars and structure outlines are provided. The cross-hatched regions 55 in FIGS. 1 and 2 are unprotected during the proton isolation step of the fabrication process. In this way, the protected portion, which defines the transport channel 54, has the normal semiconducting properties of the epitaxial layers. The remaining portions are bombarded with the high energy protons in order to render them electrically insulating.

COMPLEMENTARY MULTIPLEXER

Two or more ACT devices can be appropriately interconnected at the drains thereof in order to provide a high speed time domain multiplexer. Those skilled in the art understand that multiplexing is a process permitting the simultaneous electronic transmission of two or more messages in one or both directions over a single transmission path, with the signals being separated in time. Different time intervals are employed for different signals. Two or more different signals may therefore be transmitted in time sequence, the instantaneous amplitude of each signal being sampled and transmitted in sequence.

Figure 4A:
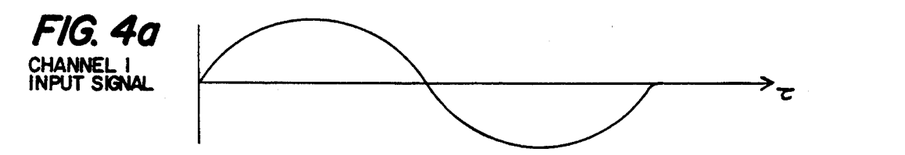
FIGS. 4a–g are graphs illustrating operation of a complementary multiplexer having two channels but unequal delays.
Figure 4B:
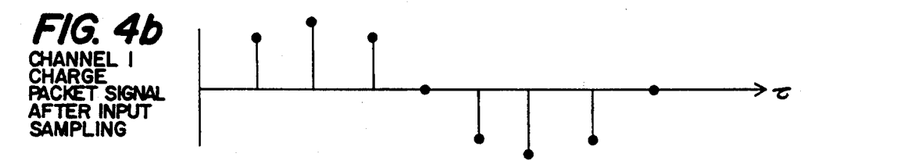
Figure 4C:
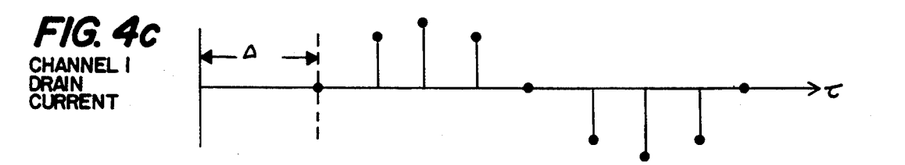
Figure 4D:
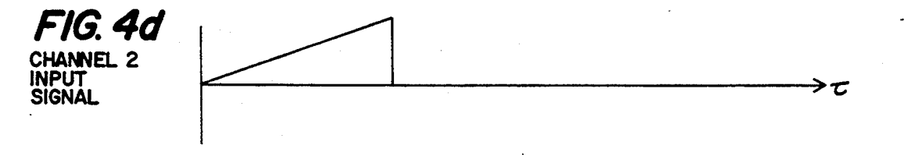
Figure 4E:
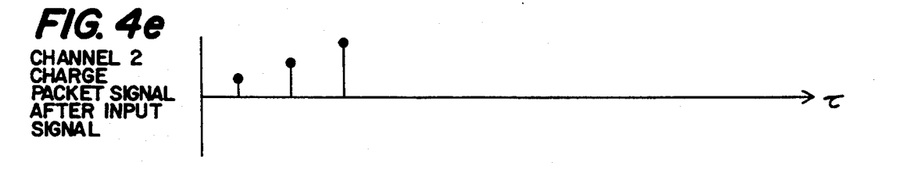
Figure 4F:
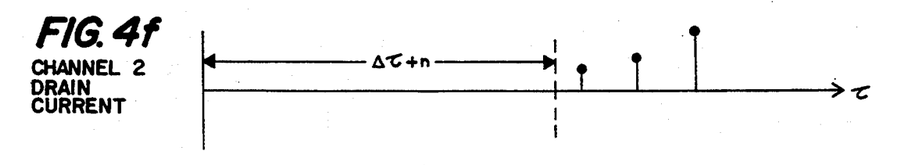
Figure 4G:
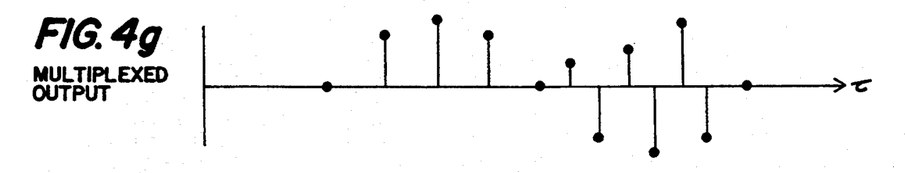

FIGS. 3a–3g illustrate complementary multiplexer operation according to the invention wherein the signals have a common delay characteristic. FIGS. 4a–4g, on the other hand, illustrate complementary multiplexer operation according to the invention wherein the devices have differing delay time. FIG. 4g illustrates a situation wherein the multiplexed output is based upon non-uniform time intervals for the respective signals. Those skilled in the art will appreciate that where the ith delay line differs in delay, then the ith input signal samples are effectively delayed or advanced with respect to the time samples of the other input signals before the multiplexing or summation operation occurs at the interconnected drains.

Use of plural ACT devices as a complementary multiplexer is most advantageously performed when the ACT devices have substantially identical precision charge injection and destructive charge detection structures. Also, substantially identical transport channel geometries and charge transport characteristics are preferred, although the source to drain spacing (source-drain delay) may be different in each device. Those skilled in the art will understand that a precision charge injection structure is capable of high speed charge injection in a time interval much less than the SAW period. This may be achieved if the dimension of the input contact in the SAW propogation dimension is relatively small and if the gap between the ohmic input contact and the Schottky channel plate is small (less than one-half of a SAW wavelength). In a device with an input gate, then the gaps between the input gate and the input contact and the input gate and the Schottky channel plate should be small. In devices with multiple input gates, then all gaps should be small.

The precision destructive charge detection structure has similar properties, although the output contact may be a Schottky barrier or an ohmic contact. In either case, the gap between this contact and the Schottky channel plate should be small, again less than one-half of a SAW wavelength. In both the input and output structures, the gap sizes are much more critical than the feature sizes in determining injection and detection speeds.

A reasonable degree of channel balance is also essential to proper operation. The quality and accuracy of the multiplexer is determined, to a large extent, by the degree to which the operating characteristics of the channels are balanced. For instance, the exact instant in time in which input sampling by the SAWs takes place in each of the channels is somewhat dependent upon the input structures, the semiconductor material characteristics, SAW amplitudes and quiescent operating currents. Even if the SAWs are perfectly complementary at the sources and drains, precisely equal intervals between the sampling time instants of each channel are only obtained when the input structures, semiconductor material, SAW amplitudes and quiescent operating currents are substantially identical between the channels. Similar conditions apply to precise timing of the drain signals. For this reason, integration of the N ACT channels in close proximity to each other on one chip, preferably being energized by one SAW beam, is preferred.

The SAW signals as observed at the drains of the N delay lines must be N-phase complementary. Complementary SAW signals at the drains results in cancellation of the detected SAW signals. SAW signal cancellation at the drain interconnection is a result of proper multiplexer operation and construction, it is not a cause of proper operation.

Complementary multiplexer operation is realized when the drains of the N channels are electrically interconnected by connections of relatively equal electromagnetic propagation delay. If the electromagnetic propagation delay of the interconnections is a significant fraction of the multiplexed output sample-to-sample time spacing, then these delays must be balanced. Integration of multiple ACT channels and their interconnection on one chip substrate is therefore preferred, because the microcircuit interconnection lengths can be much smaller than with discrete external connections.

Figure 6:
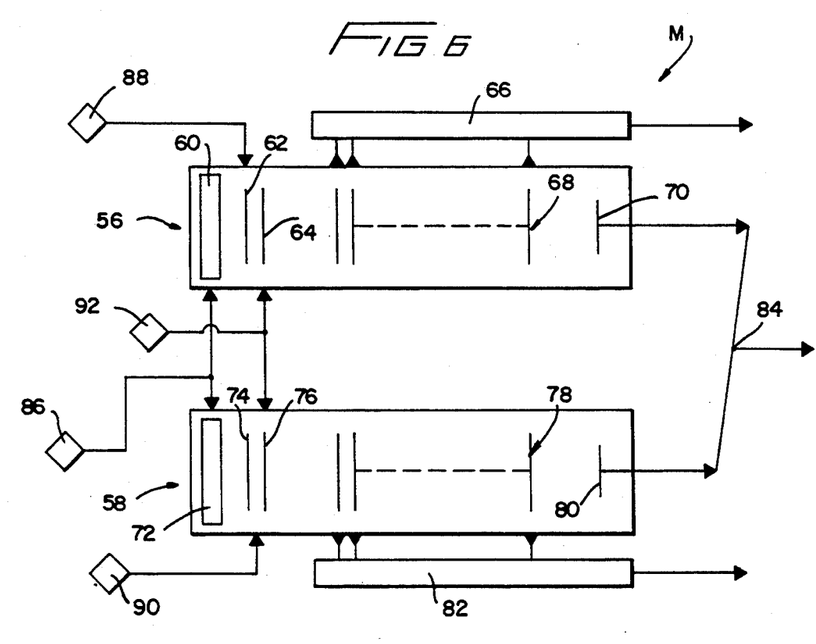
FIG. 6 is a schematic view of a complementary multiplexer according to the invention.

FIG. 6 illustrates a complementary multiplexer M which is comprised of first ACT device 56 and second substantially identical ACT device 58. Device 56 includes a SAW transducer assembly 60 disposed adjacent input contact or source 62 and gate 64. Non-destructive sensing contact assembly 66 overlies transport channel 68. Drain or output contact 70 extracts the charge transported through channel 68.

Device 58 has a correspondingly similar transducer assembly 72, input contact or source 74 and gate 76. Injected charge is transported through channel 78 to drain or output contact 80. As with device 56, the transport channel 78 is overlayed with a non-destructive sensing assembly 82. The drains 70 and 80 are connected in parallel at 84, at which point the delayed signals of the devices 56 and 58 are multiplexed or summed.

The transducer assemblies 60 and 72 are operably connected to SAW power source 86 which assures proper phase relationship of the generated SAWs. Preferably, main signal source 88 feeds input 62 of device 56, while complementary signal source 90 feeds input 74. Those skilled in the art will appreciate that, because gallium arsenide is the preferred material for substrate 14, the signal sources 88 and 90 may include optical devices, as well as the illustrated electrical sources. The devices 56 and 58 may also include a controller 92 which is operably connected with the gates 64 and 76, when gates are used. The controller 92 provides one means for allowing a control signal to modulate the amplitude of the signal at the inputs. As noted previously, the gates 64 and 76 are optional, as is the controller 92.

Figures 7, 8:
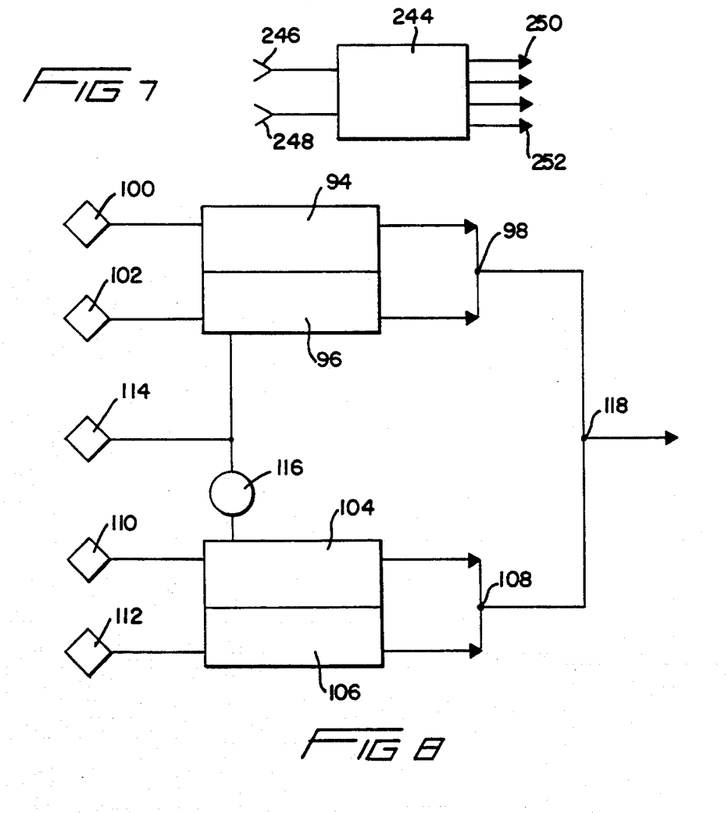
FIG. 7 is a diagrammatic form of the complementary pair acoustic charge transport device of the invention.
FIG. 8 is a schematic view of a four channel multiplexer according to the invention.

FIG. 8 illustrates a complementary multiplexer incorporating four ACT devices in order to achieve 4:1 multiplexing. For the sake of clarity, the transducers, inputs, gates and the like have been omitted, although those skilled in the art will understand that corresponding structures are provided as above noted.

The quadrature device of FIG. 8 includes first and second ACT devices 94 and 96 having the drains thereof connected in parallel at 98. The devices 94 and 96 have signal sources 100 and 102, respectively. The signals transmitted by the sources 100 and 102 are selectively sampled and delayed by the devices 94 and 96 so that the output thereof is multiplexed at 98 as above described.

Third and fourth ACT devices 104 and 106 similarly have the drains thereof connected at 108 for multiplexing the delayed signals transmitted by signal sources 110 and 112, respectively.

Power source 114 energizes the transducers of the ACT devices 94, 96 and 104, 106. Phase shifter 116 is connected to SAW frequency source 114 and assures that the generated waves have the proper phase relationships.

The drain interconnection points 98 and 108 are likewise interconnected at 118 for multiplexing the multiplexed outputs from the complementary ACT devices 94, 96 and 104, 106. In this way, the quadrature device of FIG. 8 achieves a 4:1 multiplexed output signal.

As previously noted, the disclosed invention, regardless as to whether configured as a multiplexer, a demultiplexer or a delay line, is advantageously effected when the acoustic waves are complementary at the sources and/or drains. The phase relationship between the signals must be 360°/N at the interconnection points for proper complementary operation, assuming all other criteria are met.

FIGS. 5a–5d disclose a number of ways for achieving complementary phase relationship in a three channel device. The channel length of the devices of FIG. 5 are all of equal length, so that the interconnection points of the sources and/or the drains have been omitted for clarity. While FIG. 5 disclosed a three channel structure, those skilled in the art will appreciate that corresponding structural relationships are possible with essentially any number of channels, providing that at least two channels are interconnected.

Figure 5A:
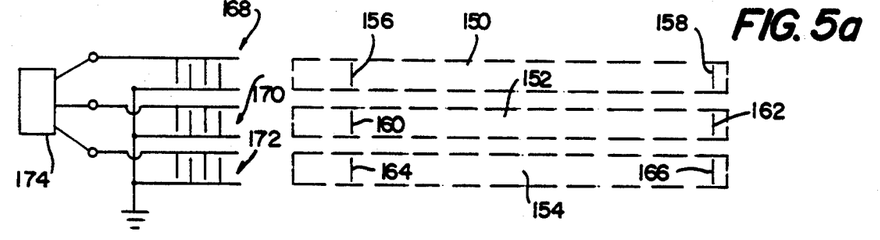
FIGS. 5a–d are schematic views illustrating a three channel structure and various mechanisms for achieving complementary operation thereof.

FIG. 5a discloses ACT devices 150, 152 and 154. Device 150 has a source 156 and a drain 158, device 152 has a source 160 and a drain 162, while device 154 has a source 164 and a drain 166. As previously noted, the devices of FIG. 5a may have the sources and/or the drains thereof interconnected in parallel in order to provide a multiplexer, a demultiplexer or a delay line.

Identical ACT channels 150, 152 and 154 have equal delays between the respective sources and drains because of the source to drain spacing. Transducers 168, 170 and 172 are spaced a uniform distance from the respective sources 156, 160 and 164. The transducers 168, 170 and 172 are driven by a three phase circuit assembly 174 which provides the required 0°, 120° and 240° SAW transducer voltages. The equal propagation delays between the transducers and the sources results in an identical three-phase relationship as observed at the sources, and as observed at the drains. Should the assembly of FIG. 5a be used as a multiplexer, then it should be clear that it is important that the complementary relationship occur at the drains 158, 162 and 166. The complementary relationship is not necessary at the sources 156, 160 and 164 when the assembly is configured as a multiplexer.

Figure 5B:
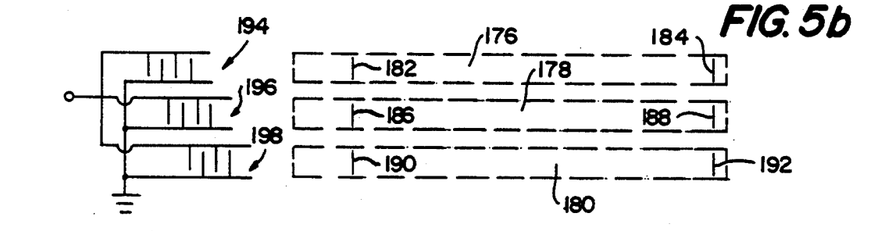

FIG. 5b discloses identical ACT channels 176, 178 and 180. The device 176 has a source 182 and a drain 184, device 178 has a source 186 and a drain 188, while device 180 has a source 190 and a drain 192. Transducers 194, 196 and 198 generate acoustic waves for the transport channels of the devices 176, 178 and 180, respectively. The transducers 194, 196 and 198 are spaced in a staggered manner from their respective sources and drains in order to create the complementary phase relationship between the generated waves. There are three channels and three transducers, so that the transducers are staggered relative to the sources by one third of an acoustic wavelength in order to achieve the required phase differences and related SAW propagation delays. The configuration of FIG. 5b has the advantage of requiring only a single phase SAW voltage.

Figure 5C:
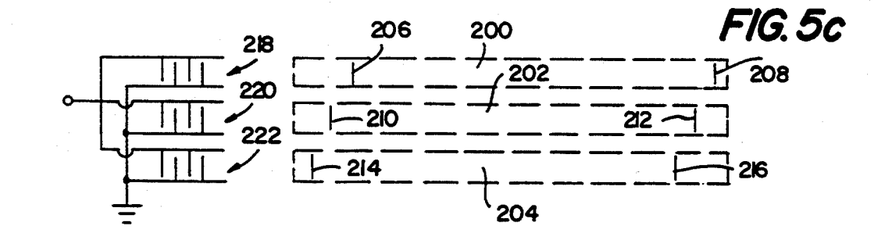

FIG. 5c discloses ACT devices 200, 202 and 204. Device 200 has a source 206 and a drain 208, device 202 has a source 210 and a drain 212, while device 204 has a source 214 and a drain 216. The transport channels of the devices 200, 202 and 204 have transducers 218, 220 and 222, respectively. The transducers 218, 220 and 222 generate the acoustic waves which propagate through the respective channels. FIG. 5c discloses, however, that the source and drain are staggered with respect to the associated transducer, thereby providing a configuration essentially the opposite of that of FIG. 5b. Those skilled in the art will understand that the sources and transducers of FIG. 5c are staggered by a distance which is proportional to one third of an acoustic wavelength. Naturally, the distance staggering is related to the number of channels and is related to the wavelength divided by the number of channels.

Figure 5D:
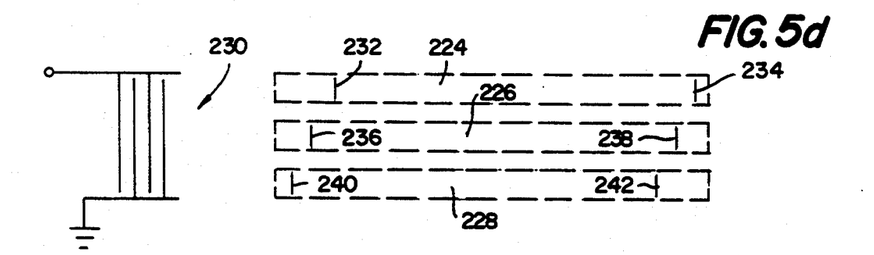

FIG. 5d discloses a configuration particularly appropriate for a complementary device integrated onto a substrate. ACT devices 224, 226 and 228 are disposed adjacent interdigital SAW transducer 230. The transducer 230 generates a single SAW which propagates through each of the transport channels and thereby avoids the need for a separate transducer unit for each channel. Naturally, the device 224 has a source 232 and a drain 234, the device 226 has a source 236 and a drain 238 while the device 228 has a source 240 and a drain 242.

There is a fixed chip area overhead associated with the construction of a transducer beyond that required to achieve a particular SAW beam width. Hence, the single transducer embodiment of FIG. 5d minimizes the required chip area and permits the ACT channels to be very closely spaced. This is particularly advantageous for achieving the accurate channel balance required to optimize the full potential of the complementary device. As noted previously, integration of multiple channels onto a single substrate is advantageous because the channel transport properties are essentially uniform, particularly when a single transducer generates the acoustic wave.

The embodiment of FIG. 5d is furthermore advantageous because proton isolation techniques can be used to isolate the devices 224, 226 and 228. Proton isolation techniques provide a very effective electrical insulation barrier between channels, even though the proton bombarded area is transparent to the generated SAW. Therefore, the channels are electrically isolated from one another but may be energized by a SAW generated from a source which is common to all channels.

FIG. 7 discloses a diagrammatic representation of a two channel complementary SAW device. The complementary device 244 has signal inputs 246 and 248 and signal outputs 250 and 252.

COMPLEMENTARY DEMULTIPLEXER

Figure 9:
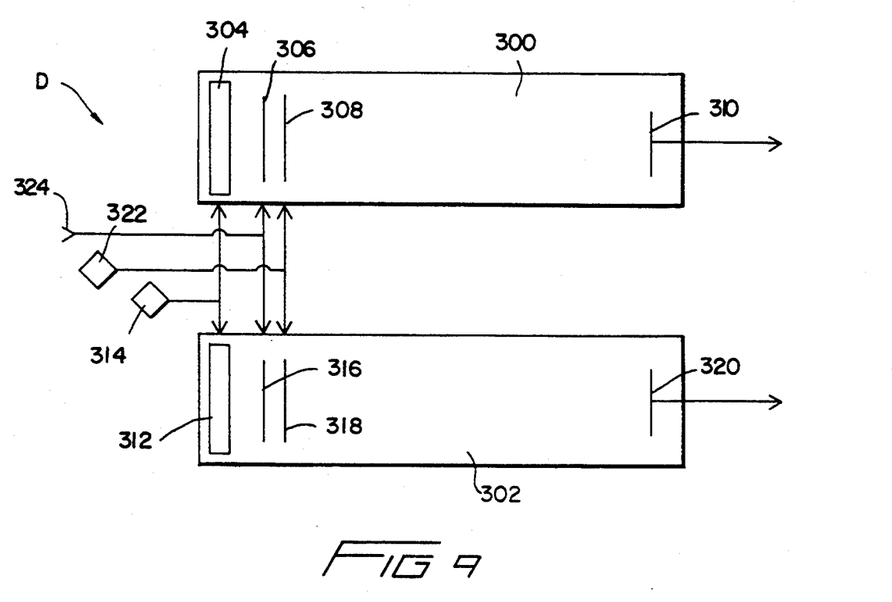
FIG. 9 is a schematic view illustrating a complementary demultiplexer according to the invention; and, FIG. 10 is a schematic view illustrating a complementary high speed delay line according to the invention.

The complementary demultiplexer D of the invention is illustrated for a two channel embodiment in FIG. 9. Complementary demultiplexer D includes a first ACT device 300 and a second device 302. The devices 300 and 302 correspond with the devices 56 and 58 of FIG. 6 and are substantially identical to the ACT device A disclosed in FIGS. 1 and 2.

Device 300 has a transducer 304 generating a SAW which propagates through the transport channel of the device. The device 300 furthermore includes a source 306, a gate 308 and a drain 310 through which the delayed signal is extracted.

The device 302 includes an interdigital SAW transducer 312 which is driven by power source 314, which likewise powers transducer 304. While transducers 304 and 312 are shown as being powered by source 314, those skilled in the art will appreciate that various configurations for achieving complementary wave relationship, as shown in FIG. 5, can be applied to the demultiplexer D.

Device 302 likewise includes a source 316, a gate 318 and a drain 320. The gates 308 and 318 are connected to controller 322.

Signal source 324 feeds input sources 306 and 316 with a signal which is to be demultiplexed. The waves generated by the transducers 304 and 312 are N-phase complementary at the souces 306 and 316 so that the signal is selectively sampled when the positive peak of a wave passes under its associated source. The sampled signals are then transported along the associated transport channels and are extracted through the drains 310 and 320, respectively, thereby providing a demultiplexed output signal.

The complementary demultiplexer D performs as a time domain demultiplexer followed by the delay of each channel. Since the demultiplexing effectively takes place at the interconnected sources, the circuit element samples an input signal at the rate of $Nf_0$ and demultiplexes the samples into $N(f_0\text{-rate})$ charge signal samples corresponding to the N channels. The charge signal samples in the ith channel are then delayed before detection at the drain by the delay of the ith channel.

The SAW signals, as observed at the sources of the N delay lines, must be N-complementary. The complementary demultiplexer operation is realized when the sources of the N channels are interconnected. Preferably, the demultiplexer D also has identical, precision charge injection and destructive charge detection structures as in the complementary multiplexer M. Likewise, substantially identical transport channel geometries and charge transport characteristics are provided, as well as a reasonable degree of channel balance and relatively equal electromagnetic propagation delay.

COMPLEMENTARY DEMULTIPLEXER—MULTIPLEXER (High Speed Delay Line)

Figure 10:
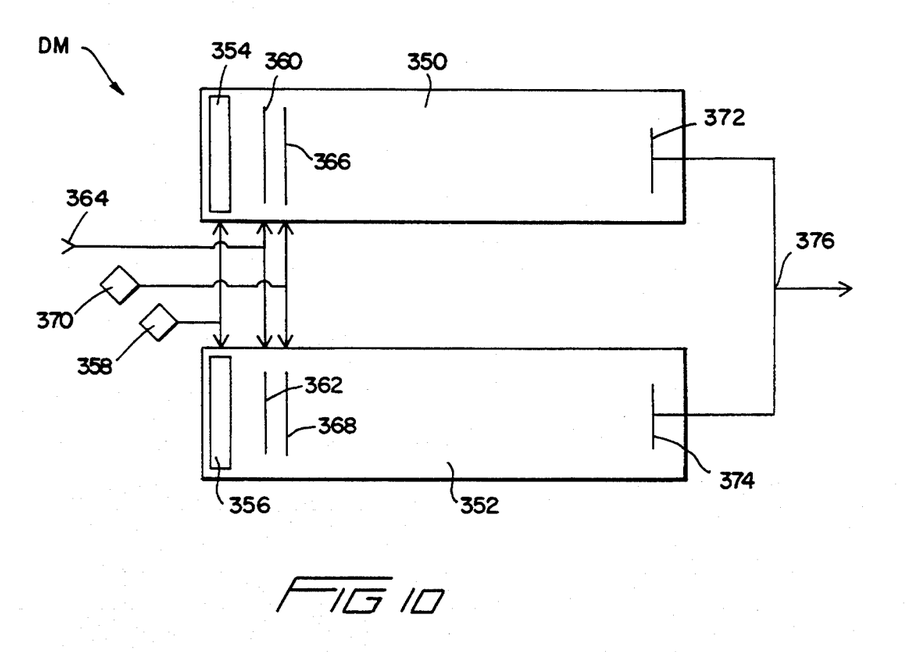

The complementary demultiplexer-multiplexer DM is illustrated in FIG. 10 for a two channel embodiment, although a greater number of channels are possible. The circuit element DM includes first ACT device 350 and a second ACT device 352. Device 350 includes a transducer 354 and device 352 includes a transducer 356. The tranducers 354 and 356 are powered through SAW power source 358, although, once again, FIG. 5 discloses various mechanisms for accomplishing the N-phase relationship required.

Device 350 includes a source 360 while device 352 includes a source 362. The sources 360 and 362 are connected in parallel to signal source 364. The devices 350 and 352 each include an optional gate 366 and 368, respectively, each of which is connected with gate controller 370. The drains 372 and 374 of the devices 350 and 352, respectively, are interconnected at 376, at which point the delayed signals are multiplexed.

The complementary demultiplexer-multiplexer DM has the same basic operating criteria as the complementary multiplexer M and the complementary multiplexer D, with the exception that the delay lines have equal delay. Furthermore, the SAW's are N-phase complementary at the drains and the sources, which drains and sources are interconnected in parallel, respectively.

The complementary demultiplexer-multiplexer DM is a circuit element which performs the function of a delay line having greatly increased sampling rate. The circuit element may be thought of as a time domain demultiplexer having its N outputs directly connected to the N inputs of a time domain multiplexer. The circuit element thus performs as an increased rate delay line sampling system having the primary advantage of permitting increased sampling rate and correspondingly increased Nyquist bandwidth. Furthermore, the undesired SAW signals are cancelled at the multiplexing point 376. Although the demultiplexer-multiplexer DM of FIG. 10 is shown as combining two essentially identical channels, those skilled in the art will understand that a greater number of channels can be appropriately configured, the requirement being that there is at least two channels of equal delay although many more can be accommodated.

While this invention has been described as having a preferred design, it is understood that it is capable of further modifications, used and/or adaptations of the invention following in general the principle of the invention and including such departures from the present disclosure as come within known or customary practice in the art to which the invention pertains, and as may be applied to the central features hereinbefore set forth, and fall within the scope of the invention of the limits of the appended claims.

What we claim is:

1. A circuit element, comprising:
   a) first and second buried channels, each of said channels comprising a piezoelectric semiconductor and each channel having a source through which charge is injected and a drain from which charge is extracted;
   b) means for propagating a surface acoustic wave through each of said channels, the propagated waves for transporting charge between the associated sources and drains;
   c) means for interconnecting in parallel said drains; and,
   d) means operably associated with said channels for assuring that the waves are complementary at said interconnected drains.

2. The element of claim 1, wherein:
   a) said propagating means includes transducer means.

3. The element of claim 2, wherein:
   a) said transducer means is common to said channels; and,
   b) said interconnected drains are offset from said transducer means a distance sufficient to assure that the propagated waves are complementary at the point of interconnection.

4. The element of claim 2, wherein:
   a) said transducer means includes first and second transducers, each of said transducers is associated with one of said channels.

5. The element of claim 4, wherein:
   a) said first and second transducers are spaced a common distance from the associated channels; and,
   b) said interconnected drains are disposed in staggered relation relative to the associated transducers.

6. The element of claim 4, wherein:
   a) said channels are disposed in parallel relation;
   b) said channels having common dimensions of length, width and depth; and,
   c) said first and second transducers are disposed in staggered relation relative to the associated channels.

7. The element of claim 2, wherein:
   a) said transducer means includes a 2-phase transducer, the phases thereof being complementary.

8. A circuit element comprising:
   a) first and second buried channels, each of said channels comprising a piezoelectric semiconductor and each channel having a source through which charge is injected and a drain from which charge is extracted;
b) means for propagating a surface acoustic wave through each of said channels, the propagated waves for transporting charge between the associated sources and drains;
c) means for interconnecting in parallel said sources; and,
d) means operably associated with said channels for assuring that the waves are complementary at said interconnected sources.

9. The element of claim 8, wherein:
a) said propagating means includes transducer means.

10. The element of claim 9, wherein:
a) said transducer means is common to said channels; and,
b) said interconnected sources are offset from said transducer means a distance sufficient to assure that the propagated waves are complementary at the point of interconnection.

11. The element of claim 9, wherein:
a) said transducer means includes first and second transducers, each of said transducers is associated with one of said channels.

12. The element of claim 11, wherein:
a) said transducer means are spaced a common distance from the associated channels; and,
b) the interconnected sources are disposed in staggered relation relative to the associated transducers.

13. The element of claim 11, wherein:
a) said channels are disposed in parallel relation;
b) said channels have common dimensions of length, width and depth; and,
c) said transducers are disposed in staggered relation relative to the associated channels.

14. The element of claim 8, wherein:
a) said transducer means includes a 2-phase transducer, the phases thereof being complementary.

15. A circuit element, comprising:
a) first and second buried channels, each of said channels comprising a piezoelectric semiconductor and each channel having a source through which charge is injected and a drain from which charge is extracted;
b) means for propagating a surface acoustic wave through each of said channels, the propagated waves for transporting charge between the associated sources and drains;
c) means for interconnecting in parallel said drains;
d) means for interconnecting in parallel said sources; and,
e) means operably associated with said channels for assuring that the waves are complementary at said interconnected drains and said interconnected sources.

16. The element of claim 15, wherein:
a) said propagating means includes transducer means.

17. The element of claim 16, wherein:
a) said transducer means is common to said channels;
b) said interconnected drains are offset from said transducer means a distance sufficient to assure that the propagated waves are complementary at the point of interconnection of said drains; and,
c) said interconnected sources are offset from said transducer means a distance sufficient to assure that the propagated waves are complementary at the point of interconnection of said sources.

18. The element of claim 16, wherein:
a) said transducer means includes first and second transducers, each of said transducers associated with one of said channels.

19. The element of claim 18, wherein:
a) said first and second transducers are spaced a common distance from the associated channels;
b) said interconnected drains are disposed in staggered relation relative to the associated transducers; and,
c) said interconnected sources are disposed in staggered relation relative to the associated transducers.

20. The element of claim 18, wherein:
a) said channels are disposed in parallel relation;
b) said channels have common dimensions of length, width and depth; and,
c) said transducers are disposed in staggered relation relative to the associated channels.

21. The element of claim 15, wherein:
a) said transducer means includes a 2-phase transducer, the phases thereof being complementary.

22. An integrated device, comprising:
a) a piezoelectric semiconductor substrate;
b) means associated with said substrate for defining a plurality of buried channels therein, said defining means being transparent to a surface acoustic wave and electrically isolating one channel from another;
c) a source associated with each of said channels for injecting charge therein;
d) a drain associated with each of said channels for extracting charge therefrom;
e) transducer means associated with each of said channels for propagating a surface acoustic wave therethrough and the propagated waves for transporting charge from a source to the associated drain;
f) said drains being interconnected in parallel; and,
g) said transducer means and said interconnected drains being disposed so that the propagated waves are complementary at the interconnected drains.

23. The device of claim 22, wherein:
a) said transducer means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

24. The device of claim 22, wherein:
a) said transducer means is common to each of said channels; and,
b) said interconnected drains are offset from said transducer means and from each other a distance sufficient to assure that the surface acoustic waves are complementary at said interconnected drains.

25. The device of claim 22, wherein:
a) said transducer means includes a plurality of transducers, each of said transducers is associated with one of said channels;
b) said transducers are spaced a common distance from the associated channels; and,
c) said interconnected drains are disposed in staggered relation relative to the associated transducers.

26. An integrated device, comprising:
a) a piezoelectric semiconductor substrate;

b) means associated with said substrate for defining a plurality of buried channels therein, said defining means being transparent to a surface acoustic wave and electrically isolating one channel from another;
c) a source associated with each of said channels for injecting charge therein;
d) a drain associated with each of said channels for extracting charge therefrom;
e) transducer means associated with each of said channels for propagating a surface acoustic wave therethrough and the propagated waves for transporting charge from a source to the associated drain;
f) said sources being interconnected in parallel; and,
g) said transducer means and said interconnected sources being disposed so that the propagated waves are complementary at the interconnected sources.

27. The device of claim 26, wherein:
a) said transducer means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

28. The device of claim 26, wherein:
a) said transducer means is common to each of said channels; and,
b) said interconnected sources being offset from said transducer means and from each other a distance sufficient to assure that the surface acoustic waves are complementary at the interconnected sources.

29. The device of claim 26, wherein:
a) said transducer means includes a plurality of transducers, each of said transducers is associated with one of said channels;
b) said transducers are spaced a common distance from the associated channels; and,
c) said interconnected sources are disposed in staggered relation relative to the associated transducers.

30. An integrated device, comprising:
a) a piezoelectric semiconductor substrate;
b) means associated with said substrate for defining a plurality of buried channels therein, said defining means being transparent to a surface acoustic wave and electrically isolating one channel from another;
c) a source associated with each of said channels for injecting charge therein;
d) a drain associated with each of said channels for extracting charge therefrom;
e) transducer means associated with each of said channels for propagating a surface acoustic wave therethrough and the propagated waves for transporting charge from a source to the associated drain;
f) said drains being interconnected in parallel;
g) said sources being interconnected in parallel; and,
h) said transducer means, said interconnected drains and said interconnected drains being disposed so that the propagated waves are complementary at said interconnected sources and said interconnected drains.

31. The device of claim 30, wherein:
a) said transducer means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

32. The device of claim 30, wherein:
a) said transducer means is common to each of said channels;
b) said interconnected drains are offset from said transducer means and from each other a distance sufficient to assure that the surface acoustic waves are complementary at said interconnected drains; and,
c) said interconnected sources are offset from said transducer means and from each other a distance sufficient to assure that the surface acoustic waves are complementary at said interconnected sources.

33. The device of claim 30, wherein:
a) said transducer means includes a plurality of transducers, each of said transducers is associated with one of said channels;
b) said transducers are spaced a common distance from the associated channels;
c) said interconnected drains are disposed in staggered relation relative to the associated transducers; and,
d) said interconnected sources are disposed in staggered relation relative to the associated transducers.

34. An acoustic charge transport assembly, comprising:
a) a plurality of substantially identical ACT devices;
b) each of said ACT devices having a piezoelectric semiconductor channel having a source through which charge is injected and a drain through which charge is extracted;
c) each of said drains being interconnected in parallel;
d) means for propagating a surface acoustic wave through each of said channels for transporting charge between a source and the associated drain, each of said waves being equal in wavelength;
e) means for phase shifting at the interconnected drains the respective surface acoustic wave relative to the adjacent wave in its respective channel by an amount proportional to said wavelength divided by the number of said ACT devices;
f) whereby separate input signals applied to each of said sources are sampled at staggered points in time, delayed and detected at staggered points in time, thereby providing a series of output signal samples which are the time multiplex of the input signal samples.

35. The assembly of claim 34, wherein:
a) said propagating means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

36. The assembly of claim 34, wherein:
a) said propagating means is common to said channels; and, b) said interconnected drains are offset from said propagating means a distance sufficient to assure that the propagated waves are complementary at the point of interconnection.

37. The assembly of claim 34, wherein:
a) said propagating means includes a plurality of transducers, each of said transducer means being associated with one of said channels.

38. The assembly of claim 37, wherein:
a) said transducers are disposed proximate said sources.

39. The assembly of claim 38, wherein:
a) each of said drains is disposed a preselected distance from said transducers so that the surface acoustic waves are complementary at any one drains.

40. The assembly of claim 37, wherein:
a) said transducer means includes a multiphase transducer assembly, each of the phases being associated with one of said channels.

41. A acoustic charge transport assembly, comprising:
a) a plurality of substantially identical ACT devices;
b) each of said ACT devices having a piezoelectric semiconductor channel having a source through which charge is injected and a drain through which charge is extracted;
c) each of said sources being interconnected in parallel;
d) means for propagating a surface acoustic wave through each of said channels for transporting charge between a source and the associated drain, each of said waves being equal in wavelength;
e) means for phase shifting at the interconnected sources the respective surface acoustic wave relative to the adjacent wave in its respective channel by an amount proportional to said wavelength divided by the number of said ACT devices;
f) whereby a common input signal applied to said interconnected sources is sequentially sampled at staggered points in time by each of said sources, delayed and detected at respective drains, thereby providing a plurality of outputs of the common input, representing the time demultiplexed outputs associated with the common input signal.

42. The assembly of claim 41, wherein:
a) said propagating means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

43. The assembly of claim 41, wherein:
a) said propagating means is common to said channels; and,
b) said interconnected sources are offset from said propagating means a distance sufficient to assure that the propagated waves are complementary at the point of interconnection.

44. The assembly of claim 41, wherein:
a) said propagating means includes a plurality of transducers, each of said transducers being associated with one of said channels.

45. The assembly of claim 44, wherein:
a) said transducers are disposed proximate said sources.

46. The assembly of claim 45, wherein:
a) each of said sources is disposed a preselected distance form said transducers so that the surface acoustic waves are complementary at any one source.

47. The assembly of claim 41, wherein:
a) said propagating means includes a multiphase transducer assembly, each of the phases being associated with one of said channels.

48. An acoustic charge transport assembly, comprising:
a) a plurality of substantially identical ACT devices;
b) each of said ACT devices having a piezoelectric semiconductor channel having a source through which charge is injected and a drain through which charge is extracted;
c) each of said drains being interconnected in parallel;
d) each of said sources being interconnected in parallel;
e) means for propagating a surface acoustic wave through each of said channels for transporting charge between a source and the associated drain, each of said waves being equal in wavelength and frequency;
f) means for phase shifting at said interconnected drains and said interconnected sources the respective surface acoustic wave relative to the adjacent wave in its respective channel by an amount proportional to to said frequency divided by the number of said ACT devices;
g) whereby said assembly behaves as a single input-single output delay line with-a sampling rate equal to the number of said ACT devices multiplied by said frequency.

49. The assembly of claim 48, wherein:
a) said propagating means includes a plurality of transducers, each of said transducers is associated with one of said channels;
b) said channels are disposed in parallel relation;
c) said channels have common dimensions of length, width and depth; and,
d) said transducers are disposed in staggered relation relative to the associated channels.

50. The assembly of claim 48, wherein:
a) said propagating means is common to said channels; and
b) said interconnected drains and said interconnected sources are offset from said propagating means a distance sufficient to assure that the propagated waves are complementary at the point of interconnection of said drains and said sources.

51. The assembly of claim 48, wherein:
a) said propagating means includes a plurality of transducers, each of said transducer means being associated with one of said channels.

52. The assembly of claim 51, wherein:
a) said transducers are disposed proximate said sources.

53. The assembly of claim 52, wherein:
a) each of said sources and drains are disposed a preselected distance from the associated transducer so that the waves are complementary at any one source and at any associated drain.

54. The assembly of claim 48, wherein:
a) said propagating means includes a multiphase transducer assembly, each of the phases being associated with one of said channels.

* * * * *